United States Patent
Hiraishi et al.

(12) 
(10) Patent No.: US 6,506,260 B1
(45) Date of Patent: Jan. 14, 2003

(54) METHOD FOR CLEANING PHOTOVOLTAIC MODULE AND CLEANING APPARATUS

(75) Inventors: Masafumi Hiraishi, Shiga (JP); Masataka Kondo, Kobe (JP); Hideo Yamagishi, Kyoto (JP); Katsuhiko Hayashi, Shiga (JP); Toshihide Okatsu, Osaka (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/532,197

(22) Filed: Mar. 22, 2000

(30) Foreign Application Priority Data

Jul. 29, 1999 (JP) .......................... 11-215177
Jul. 29, 1999 (JP) .......................... 11-215178

(51) Int. Cl.$^7$ .............. B08B 3/02; B08B 3/12; B08B 5/02

(52) U.S. Cl. .............. 134/15; 134/1; 134/1.3; 134/2; 134/34; 134/42; 134/902

(58) Field of Search .............. 134/1, 1.3, 2, 9, 134/15, 34, 42, 22.12, 25.1, 902; 15/300.1, 320, 21.1, 38

(56) References Cited

U.S. PATENT DOCUMENTS

| | | | |
|---|---|---|---|
| 3,849,195 A | | 11/1974 | Powell et al. |
| 4,854,337 A | * | 8/1989 | Bunkenburg et al. .......... 134/1 |
| 5,464,477 A | * | 11/1995 | Awad ............................. 134/1 |
| 5,512,106 A | * | 4/1996 | Tamai et al. .................... 134/2 |
| 5,762,749 A | | 6/1998 | Suzuki et al. |
| 5,853,489 A | * | 12/1998 | Kitazawa ........................ 134/1 |
| 5,894,853 A | * | 4/1999 | Fujisaki et al. ................ 134/10 |
| 5,913,980 A | * | 6/1999 | Bathey ............................ 134/2 |
| 5,989,355 A | * | 11/1999 | Brandt et al. .................... 134/6 |
| 5,993,739 A | * | 11/1999 | Lyon ............................. 134/108 |
| 6,033,484 A | * | 3/2000 | Mahoney ........................ 134/1 |
| 6,057,240 A | * | 5/2000 | Zhou et al. ................ 106/14.15 |
| 6,123,088 A | * | 9/2000 | Ho ............................. 134/1.3 |
| 6,235,122 B1 | * | 5/2001 | Zhang et al. ................ 118/715 |

FOREIGN PATENT DOCUMENTS

| | | |
|---|---|---|
| EP | 0/661761 | 7/1995 |
| JP | 60-95980 | 5/1985 |
| JP | 60/110178 | 6/1985 |
| JP | 60-110178 | 6/1985 |
| JP | 04-116986 | 4/1992 |
| JP | 07-079007 | 3/1995 |
| JP | 10-004202 | 1/1996 |
| JP | 09-008337 | 1/1997 |
| JP | 09/260699 | 10/1997 |
| JP | 10-012901 | 1/1998 |
| JP | 10-209477 | 8/1998 |
| JP | 10/209477 | 8/1998 |
| JP | 10/214983 | 8/1998 |
| JP | 10-242489 | 9/1998 |

* cited by examiner

Primary Examiner—Randy Gulakowski
Assistant Examiner—Jiri Smetana
(74) Attorney, Agent, or Firm—Hogan & Hartson, LLP

(57) ABSTRACT

A method for cleaning a photovoltaic module, the photovoltaic module having a first electrode layer formed on an insulating substrate, a photovoltaic layer, and a second electrode layer. The laminate is electrically divided between a power generating region and peripheral regions by means of grooves. The power generating region is divided into a plurality of photovoltaic cells by means of laser-scribed grooves. At least some of the photovoltaic cells are connected electrically in series with one another. The cleaning method includes a process for transporting the photovoltaic module immersed in a cleaning fluid, while being kept in a horizontal position with the laminate upward as it is transported, and applying ultrasonic vibration to the cleaning fluid, thereby removing particles in the scribed grooves.

18 Claims, 8 Drawing Sheets

METHOD FOR CLEANING PHOTOVOLTAIC MODULE AND CLEANING APPARATUS

CROSS-REFERENCE TO RELATED APPLICATIONS

This application is based upon and claims the benefit of priority from the prior Japanese Patent Applications No. 11-215177, filed Jul. 29, 1999; and No. 11-215178, filed Jul. 29, 1999, the entire contents of which are incorporated herein by reference.

BACKGROUND OF THE INVENTION

The present invention relates to a cleaning method and a cleaning apparatus for an integrated photovoltaic module for converting light energy such as solar energy into electrical energy.

A thin-film photovoltaic module that is used in a photovoltaic apparatus of the integrated thin film type comprises a transparent first electrode layer formed on a glass substrate, an amorphous semiconductor layer, a second electrode layer, etc. Manufacturing the photovoltaic module does not require much material, and an integrated photovoltaic element with a large area can be formed directly on the substrate, so that the manufacturing cost can be lowered.

The photovoltaic module is manufactured by a method that includes a step of thin film deposition, such as CVD (chemical vapor deposition) or sputtering, and a patterning step based on laser scribing. In a typical integrated photovoltaic module, a large number of photovoltaic cells, which are connected electrically in series with one another, are formed on a glass substrate. A large-area substrate, measuring 90 cm by 45 cm, for example, is used in a photovoltaic module for electric power that is installed outdoors.

A thin-film photovoltaic module shown in FIG. 7A comprises a glass substrate 2 for use as an insulating substrate and photovoltaic cells C formed on the substrate 2. Each photovoltaic cell C includes a first electrode layer 3 formed on the substrate 2, a semiconductor photovoltaic layer 5 formed of amorphous silicon or the like, and a second electrode layer 7. In the description to follow, a laminate that includes the first electrode layer 3 formed on the substrate 2, photovoltaic layer 5, and second electrode layer 7 will be referred to as a laminate L (shown in FIGS. 7A and 7B).

In general, a transparent conductive film of tin oxide ($SnO_2$), zinc oxide (ZnO), or indium tin oxide (ITO) is used for the first electrode layer 3, while a metallic conductive material such as silver (Ag), aluminum (Al), or chromium (Cr) is used for the second electrode layer 7. The adjacent photovoltaic cells C are connected electrically in series with one another by means of the conductive material that fills grooves 6 for series connection.

The photovoltaic module 1 is manufactured in the following manner. First, the transparent conductive film is deposited as the first electrode layer 3 on the glass substrate 2. Then, grooves 4 are formed in the first electrode layer 3 by laser scribing, in order to divide the layer 3 into a plurality of regions corresponding to the photovoltaic cells C. The scribed grooves 4 extend straight at right angles to the drawing plane of FIG. 7A. The semiconductor photovoltaic layer 5 of amorphous silicon, which includes a p-i-n junction, is deposited on the first electrode layer 3 by plasma CVD. The grooves 6 are formed in the photovoltaic layer 5 by laser scribing, whereby the adjacent photovoltaic cells are connected electrically in series with one another. The grooves 6 also extend straight at right angles to the drawing plane of FIG. 7A. Subsequently, the second electrode layer 7 of metal such as Ag, Al, or Cr is formed to cover the photovoltaic layer 5. The grooves 6 are also packed with this metal. Further, grooves 8 are formed in order to divide the photovoltaic layer 5 and the second electrode layer 7 into a plurality of regions corresponding to the photovoltaic cells C. The grooves 8, which are also formed by laser scribing, also extend straight at right angles to the drawing plane of FIG. 7A. Preferably, the grooves 8 are deep enough to reach the first electrode layer 3.

[First Problem]

In some cases, particles, such as swarf, burrs, etc., may be produced in and around the grooves when the grooves are formed in the aforesaid manner by laser scribing. If the particles are left in the photovoltaic module 1, the photovoltaic cells C are electrically shorted, thus resulting in lowering of the output, insulation, and withstand voltage characteristics of the module 1.

As is described in Jpn. Pat. Appln. KOKAI Publication No. 7-79007, therefore, a proposal has conventionally been made to apply a laser beam from a glass substrate side in order to reduce swarf or burrs that are produced during the laser scribing process. Further, back-reflection electrode processing using the fourth harmonic of a YAG laser is described in Jpn. Pat. Appln. KOKAI Publication No. 10-242489. According to a known technique described in Jpn. Pat. Appln. KOKAI Publication No. 9-8337, moreover, a cleaning process is carried out after grooves are formed by laser scribing. According to another technique described in Jpn. Pat. Appln. KOKAI Publication No. 60-110178, furthermore, a photovoltaic module is subjected to ultrasonic cleaning in a cleaning fluid after grooves are formed by laser scribing.

According to the technique described in Jpn. Pat. Appln. KOKAI Publication No. 7-79007, burrs can be only reduced and not removed. Besides, groove working is slow and inefficient. According to the technique described in Jpn. Pat. Appln. KOKAI Publication No. 10-242489, the laser power lacks in stability, and the groove working speed is low. According to the techniques described in Jpn. Pat. Appln. KOKAI Publications Nos. 9-8337 and 60-110178, ultrasonic waves must be applied for a long time to remove particles deep in the grooves.

[Second Problem]

As the electrode layers 3 and 7 of the photovoltaic module 1 are formed, some of the conductive material for the layers 3 and 7 sometimes may get to the end faces and under surfaces of the substrate 2. Although the individual cells C are separated from one another on the substrate 2, in this case, they inevitably conduct to one another by means of the conductive material that adheres to the end faces and under surface of the substrate 2. This results in lowering of the output characteristics of the photovoltaic module 1.

To solve this problem, grooves 9 for insulation are formed on the peripheral edge portion of the photovoltaic module 1, as shown in FIG. 14. The grooves 9 serve electrically to separate a power generating region G, which includes the cells C and the groove 8, from its peripheral regions 10. The grooves 9 are formed covering the whole periphery of the module 1 by laser scribing. With use of the grooves 9 formed in this manner, the cells can be prevented from being short-circuited by the conductive material that adheres to the ends faces and under surface of the substrate 2.

In general, the width of each groove 9 that is formed by laser scribing ranges from about 0.05 mm to 1.0 mm. After the grooves 9 are formed, a cover layer of an electrical insulating material is formed on the second electrode layer 7. Before this cover layer is formed, a cleaning process for cleaning the photovoltaic module 1 is carried out. Before or during the cleaning process, the module 1 generates electric power to produce electromotive force as it receives surrounding light. Since the electromotive force of the photovoltaic cell C is at about 0.85V, the potential difference between cells C1 and C2 on the positive- and negative-electrode sides shown in FIG. 14 comes up to about 53V in the case of the module 1 in which 63 cells C, for example, are connected in series with one another.

Let it be supposed that a waterdrop W1 adheres to a part 9a of a groove 9, as shown in FIG. 14, with the potential difference thus maintained between the two electrodes in the cleaning process. In this case, the cell C to which the waterdrop W1 adheres and the peripheral regions 10 are electrically shorted so that their potentials are equal. In consequence, the cell C1 that is situated on the positive-electrode side of the cell C to which the waterdrop W1 adheres becomes higher in potential than the peripheral regions 10. The cell C2 that is situated on the negative-electrode side of the cell C to which the waterdrop W1 adheres becomes lower in potential than the regions 10.

Let it be supposed that new waterdrops W2 and W3 stick to the part 9a of the groove 9, as shown in FIG. 14, with the potential difference maintained between the cells and the peripheral regions 10. In this case, current flows form the low-potential side to the high-potential side between the peripheral regions 10 and the cells C between which the potential difference exists. As shown in FIG. 15, for example, therefore, a migration of a metal (e.g., silver) develops in a conduction path (short circuit) that is formed in the part 9a of the groove, and a dendrite (e.g., crystal of silver) K grows. When the waterdrops form an ion path, the speed of growth of the silver migration is approximately 0.1 mm/sec if the rate of electrolysis is at hundreds of volts per millimeters. Thus, in the cleaning process for the photovoltaic module 1, the metal migration develops in the grooves 9, and insulation failure occurs between the power generating region G and the peripheral regions 10.

In an actual cleaning process, the photovoltaic module 1 is carried into a cleaning chamber by means of a conveyor. At the start of cleaning, therefore, drops of water for use as a cleaning fluid adheres to the front of the module 1. The waterdrops cause the aforesaid migration. In the cleaning chamber, the module 1 is covered entirely with water, so that all the cells share the same potential. The speed of growth of the metallic crystal by the migration is so high, however, that a short circuit attributable to the migration is formed before all the cells reach the same potential.

In order to solve the problem of the migration, the inventor hereof proposed migration preventing means described in Jpn. Pat. Appln. KOKAI Publication No. 10-209477. In a photovoltaic module cleaning process, according to this arrangement, cells on the positive- and negative-electrode sides, among series-connected cells, and peripheral regions are shorted by means of a conductor. The conductor is removed after the cleaning process is finished. However, this migration preventing means requires laborious operations, including installing the short-circuiting conductor before cleaning the photovoltaic module, removing the conductor after the cleaning, etc. Thus, there is room for improvement.

BRIEF SUMMARY OF THE INVENTION

A cleaning method according to the present invention includes a process for transporting a photovoltaic module having scribed grooves and immersed in a cleaning fluid and applying ultrasonic vibration to the cleaning fluid. Another cleaning method according to the invention includes a process for bringing a rotating brush into contact with the surface of a laminate of a photovoltaic module and blowing pressurized air against the laminate simultaneously. Still another cleaning method according to the invention includes a process for blowing or spraying a fluid, such as pressurized water or pressurized air, along scribed grooves of the photovoltaic module by means of nozzles while moving the nozzles in parallel and relatively to the scribed grooves. Particles that are produced in the photovoltaic module by laser scribing can be efficiently removed by these cleaning methods.

A cleaning apparatus according to the invention includes a reserver tank containing a cleaning fluid, a conveyor extending through the reserver tank and capable of transporting a photovoltaic module in a manner such that the module is immersed in the cleaning fluid, while being kept in a horizontal position with the laminate upward as it is transported, and an ultrasonic vibrator for applying ultrasonic vibration to the cleaning fluid. As the photovoltaic module is transported, this cleaning apparatus applies ultrasonic vibration to the module in the cleaning fluid, thereby subjecting the module to ultrasonic cleaning. Preferably, the output of the ultrasonic vibrator ranges from 0.2 W/cm$^2$ to 1.0 W/cm$^2$.

Another cleaning apparatus includes a platform for supporting a photovoltaic module with its laminate upward, a vibration generator for applying vibration to the platform, and a jet nozzle mechanism opposed to the top surface of the photovoltaic module and capable of blowing a fluid, such as pressurized air, along scribed grooves by means of a plurality of air nozzles which are located to correspond individually to pitches of the scribed grooves while moving the air nozzles in parallel and relatively to the scribed grooves. This cleaning apparatus applies vibration to the photovoltaic module as its blows the fluid along the scribed grooves.

According to the cleaning apparatus of the invention, particles, such as swarf, burrs, etc. that are produced by laser scribing in the process of manufacturing the photovoltaic module, can be securely removed in a short time. According to this cleaning apparatus, photovoltaic modules with high output, insulation, and withstand voltage can be obtained. In this cleaning apparatus of the present invention, a large number of photovoltaic modules can be efficiently cleaned, since they are continuously cleaned during transportation in a plant. Since each photovoltaic module moves over an ultrasonic vibrator as it is cleaned, ultrasonic vibration can be applied substantially uniformly to the whole module.

A cleaning apparatus according to the invention includes a conveyor for transporting a photovoltaic module in a direction associated with the scribed grooves, a spraying mechanism for spraying a cleaning fluid against the photovoltaic module being transported, and electrical contact means extending across grooves, which divide a power generating region and peripheral regions of the module, and capable of electrically conducting at least those ones of photovoltaic cells which are situated on the positive- and negative-electrode sides of the power generating region and the peripheral regions during the transportation of the photovoltaic module. An example of the electrical contact means includes a conductive supporter ranging from the power generating region and the peripheral regions of the photovoltaic module and a conductive brush provided on the conductive supporter and capable of touching the photovoltaic cells in the power generating region and the peripheral regions.

In the cleaning apparatus of the invention, the cleaning fluid from the spraying mechanism is sprayed against the photovoltaic module to clean it while the module is being transported by means of the conveyor. The power generating region and the peripheral regions of the module can be kept at the same potential by being shorted by means of the electrical contact means. Accordingly, a potential difference can be prevented from developing between the cells and the peripheral regions before the photovoltaic module is covered entire with the cleaning fluid. Thus, there is no possibility of a short circuit being formed in the grooves by means of a metal migration. Further, there is no need of laborious operations, such as attaching to or removing a conductor for adjusting the cells to the same potential from the photovoltaic module before or after the cleaning operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 7A:
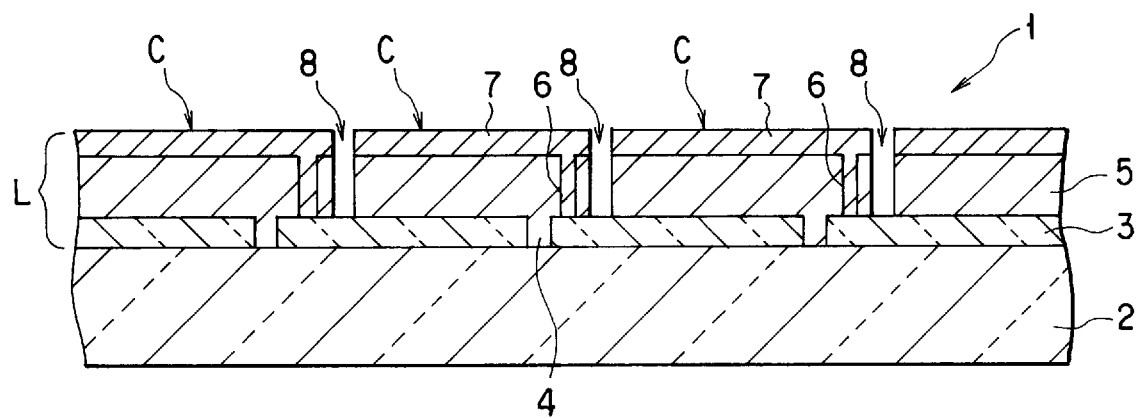
FIG. 7A is a sectional view of a part of a photovoltaic module having scribed grooves.

A first embodiment of the present invention will now be described with reference to FIG. 1. As shown in FIG. 7A, a thin-film photovoltaic module 1 as an object of cleaning comprises a glass substrate 2 for use as an insulating substrate and photovoltaic cells C that form a laminate L on the substrate 2. Each photovoltaic cell C includes a first electrode layer 3, which is formed of a transparent conductive material such as $SnO_2$, ZnO, or ITO, a semiconductor photovoltaic layer 5 formed of amorphous silicon or the like, and a second electrode layer 7 formed of a metallic material such as silver (Ag), aluminum (Al), or chromium (Cr). Grooves 6 for series connection are formed in the photovoltaic layer 5. The grooves 6 are packed with the metallic material that forms the second electrode layer 7. Each two adjacent cells C are connected electrically in series by means of the metallic material that fills the grooves 6.

The first electrode layers 3 that individually constitute the photovoltaic cells C are separated from one another by means of grooves 4. The grooves 4 are formed by laser scribing. The second electrode layer 7, which is formed of a metallic film of Ag, Al, or Cr, covers each corresponding semiconductor photovoltaic layer 5. Some of the metallic material that constitutes the second electrode layer 7 fills the grooves 6. The photovoltaic layers 5 and the second electrode layers 7 that constitute the individual photovoltaic cells C are separated electric ally from one another by means of grooves 8. These grooves 8 are also formed by laser scribing.

Figure 7B:
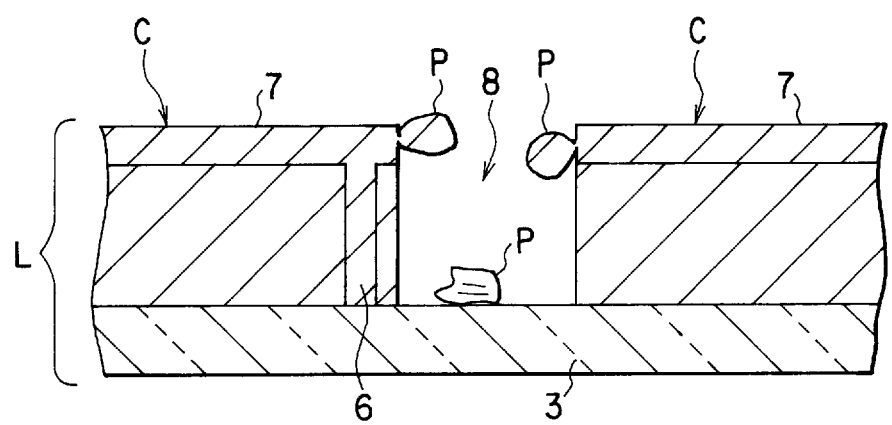
FIG. 7B is a partial enlarged sectional view of the module shown in FIG. 7A.
Figure 14:
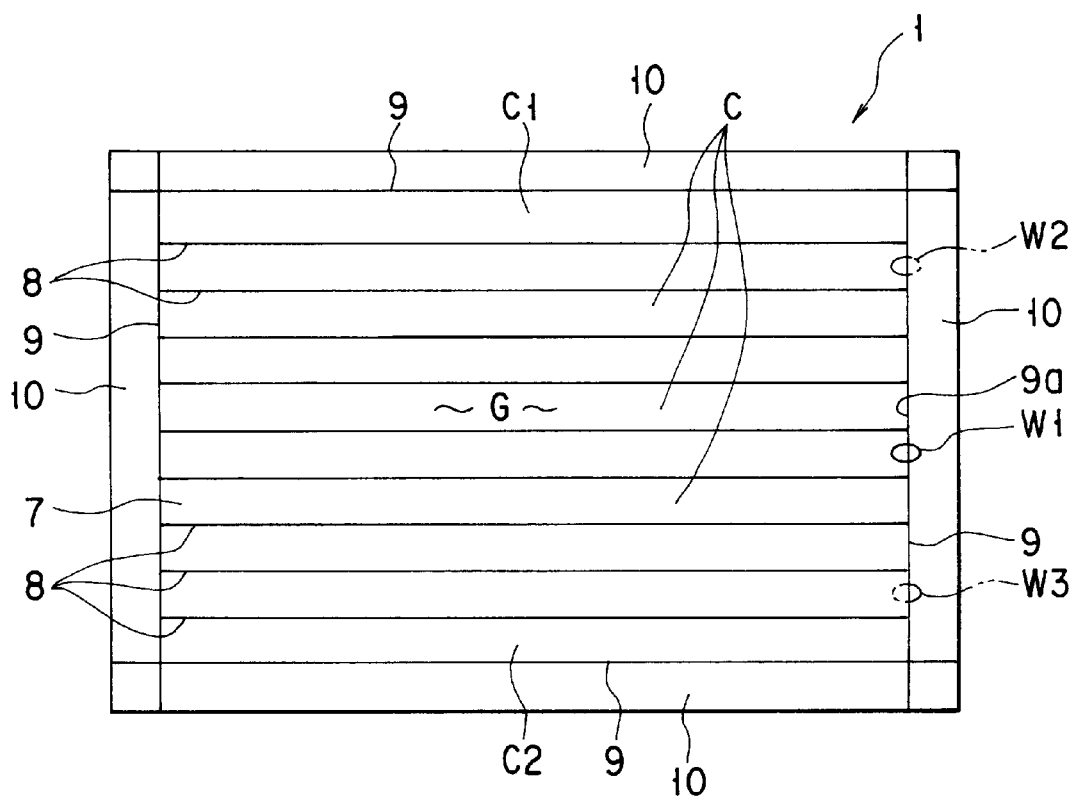
FIG. 14 is a plan view of a photovoltaic module having waterdrops thereon.
Figure 15:
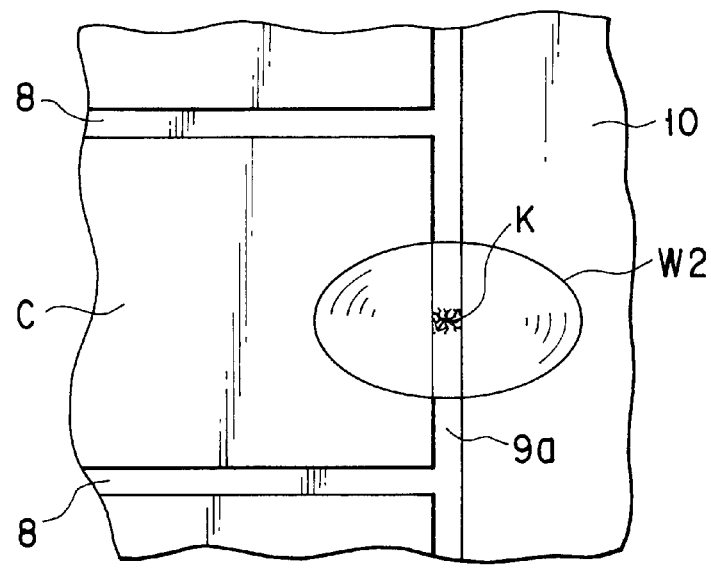
FIG. 15 is a partial enlarged plan view of the photovoltaic module shown in FIG. 14.

As shown in FIG. 7B, particles P, such as swarf, burrs, etc. that are produced by the laser scribing, may be left in the grooves 8, in some cases. The particles P may possibly be produced in the process of laser-scribing grooves 9 that separate a power generating region G from peripheral regions 10, as shown in FIG. 14, for example, as well as the grooves 8. The photovoltaic module 1 with satisfactory electrical insulating properties can be manufactured with high yield by removing the particles P from the scribed grooves.

Figure 1:
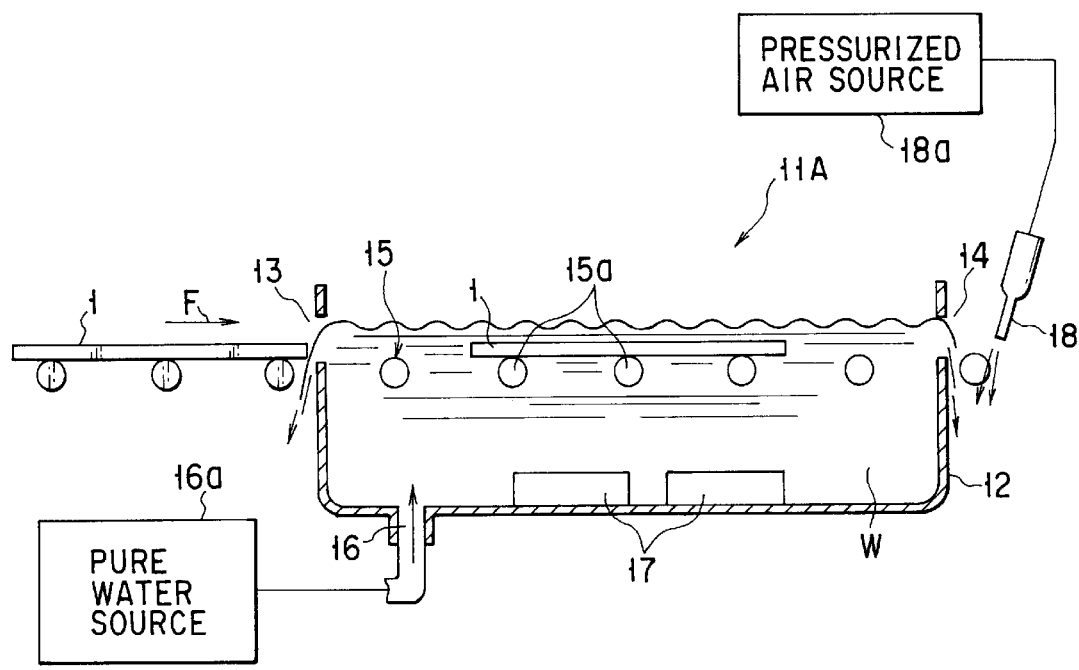
FIG. 1 is a vertical sectional view of a cleaning apparatus according to a first embodiment of the present invention.

A cleaning apparatus 11A shown in FIG. 1 is provided with an open-topped reserver tank 12. A loading aperture 13 for the photovoltaic module 1 is provided at one end of the reserver tank 12 with respect to the longitudinal direction. An unloading aperture 14 is provided at the other end of the tank 12. A horizontally extending roller conveyor 15 is located substantially on the same level with the apertures 13 and 14. The photovoltaic module 1 is kept in a horizontal position with the laminate L upward as it is transported in the direction indicated by arrow F in FIG. 1 by means of the conveyor 15. Rollers 15a that constitute the conveyor 15 are rotated by means of a rotating mechanism (not shown). The photovoltaic module 1 placed on top of the conveyor 15 is loaded into the reserver tank 12 through the loading aperture 13 and then unloaded through the unloading aperture 14.

The base portion of the reserver tank 12 is provided with a fluid feed port 16 through which pure water W as an example of a cleaning fluid is supplied. A pure water source 16a is connected to the feed port 16. Ultrasonic vibrators 17 (with output of 0.2 to 1.0 W/cm$^2$) are arranged at the bottom of the reserver tank 12. A water cutting air knife 18 is located near the unloading aperture 14. A pressurized air source 18a is connected to the air knife 18. Preferably, the pure water W in the pure water source 16a for example has purity such that its specific resistance is 16 to 18 MΩ·cm (25° C.), the number of fine particles of 0.2 μm or more is 100 to 150 per milliliter, the number of living germs is 0 to 10 per milliliter, and the organism content is 0.5 to 1.0 ppm.

The following is a description of a method for cleaning the photovoltaic module 1 by means of the cleaning apparatus 11A shown in FIG. 1. The pure water W is fed into the reserver tank 12 through the fluid feed port 16. When the level of the pure water W reaches the loading and unloading apertures 13 and 14, some of the water W overflows the tank 12. Thus, the level of the pure water W can be kept constant. Ultrasonic vibration that is generated by energizing the ultrasonic vibrators 17 propagates in the pure water W.

The photovoltaic module 1 on the conveyor 15 is loaded into the pure water W in the reserver tank 12 through the loading aperture 13. Since the ultrasonic vibration propagates in the pure water W as this is done, the particles P, such as swarf, burrs, etc., left in the scribed grooves 8 and 9 of the module 1 are separated from the module 1. The particles P separated from the module 1 are discharged from the reserver tank 12, along with the pure water W overflowing the reserver tank 12, or sink to the bottom of the tank 12. Therefore, the particles P never adhere again to the photovoltaic module 1. Since most of the particles P, along with the pure water W overflowing the reserver tank 12, are discharged from the tank 12, the degree of pollution of the tank 12 is lowered. After the cleaning is completed, the photovoltaic module 1 is discharged from the reserver tank 12 through the unloading aperture 14. The pure water W adhering to the surface of the module 1 getting out of the unloading aperture 14 and the particles P contained in its drops are blown off with pressurized air that is jetted from the air knife 18.

In the cleaning apparatus 11A constructed in this manner, the photovoltaic module 1 is transported as it is continuously cleaned in the pure water W, so that a large number of photovoltaic modules 1 can be cleaned efficiently. Since each module 1 moves at constant speed over the ultrasonic vibrators 17, moreover, the ultrasonic vibration can be applied uniformly to the whole module 1. Thus, the photovoltaic module 1 can be cleaned continuously and securely by only being passed through the reserver tank 12.

Although the roller conveyor 15 is employed as the means for transporting the photovoltaic module 1 according to this embodiment, it may be replaced with a meshed or ladder-shaped, water-permeable endless belt, for example. The cleaning fluid is not limited to the pure water W, and may alternatively be tap water that is cleared of impurities or a chemical cleaning fluid. Available chemical cleaning fluids include organic solvents, such as acetone, methanol, ethanol, trichloroethylene, Freon, etc., as well as water that contains a detergent.

Figure 2:
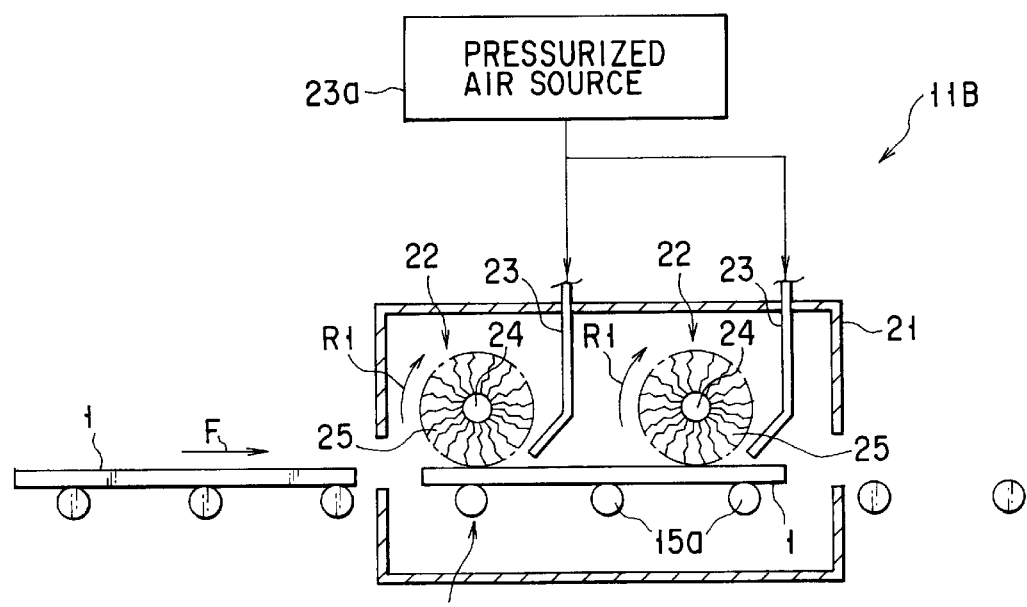
FIG. 2 is a vertical sectional view of a cleaning apparatus according to a second embodiment of the invention.

FIG. 2 shows a cleaning apparatus 11B according to a second embodiment of the invention. In the description of the cleaning apparatus 11B to follow, like reference numerals are used to designate like portions shared with the cleaning apparatus 11A according to the first embodiment, and a description of those portions is omitted. The cleaning apparatus 11B shown in FIG. 2 is provided with a tunnel-shaped cleaning box 21 in the middle of a conveyor 15. A plurality of rotary brushes 22 and air nozzles 23 are arranged in the cleaning box 21. The conveyor 15 serves to transport a photovoltaic module 1 parallel to scribed grooves 8.

Each rotary brush 22 is a roll-shaped structure including a rotating shaft 24, which can be rotated by means of a rotating mechanism (not shown), and brush fibers 25 of nylon or the like surrounding the shaft 24. As the rotating shaft 24 rotates, the respective tips of the brush fibers 25 come into contact with the surface of the laminate L (shown in FIG. 7A) of the photovoltaic module 1 and the inner surface of each scribed groove 8. The air nozzles 23 are located opposite areas near positions where the brush fibers 25 touch the module 1. A pressurized air source 23a is connected to the air nozzles 23. The nozzles 23 jet out air toward the scribed grooves 8.

The following is a description of the function of the present embodiment. The rotary brushes 22 rotate in the direction indicated by arrow R1 in FIG. 2, while pressurized air is jetted from the air nozzles 23. In this state, the photovoltaic module 1 having the scribed grooves 8 is placed on the conveyor 15. The module 1 moves in the direction indicated by arrow F in FIG. 2, and is loaded into the cleaning box 21. As the photovoltaic module 1 passes under the rotary brushes 22, the respective tips of the rotating brush fibers 25 touch the surface of the laminate L of the module 1 and the inner surface of each grooves 8. At the same time, the pressurized air jetted from the air nozzles 23 is blown against the grooves 8. Thereupon, particles P in the grooves 8 are blown off. The cleaned module 1 is discharged from the cleaning box 21 by means of the conveyor 15. Thus, the photovoltaic module 1 can be cleaned continuously and efficiently by means of the rotary brushes 22 and the air nozzles 23 by only being passed once through the cleaning box 21.

Figure 3:
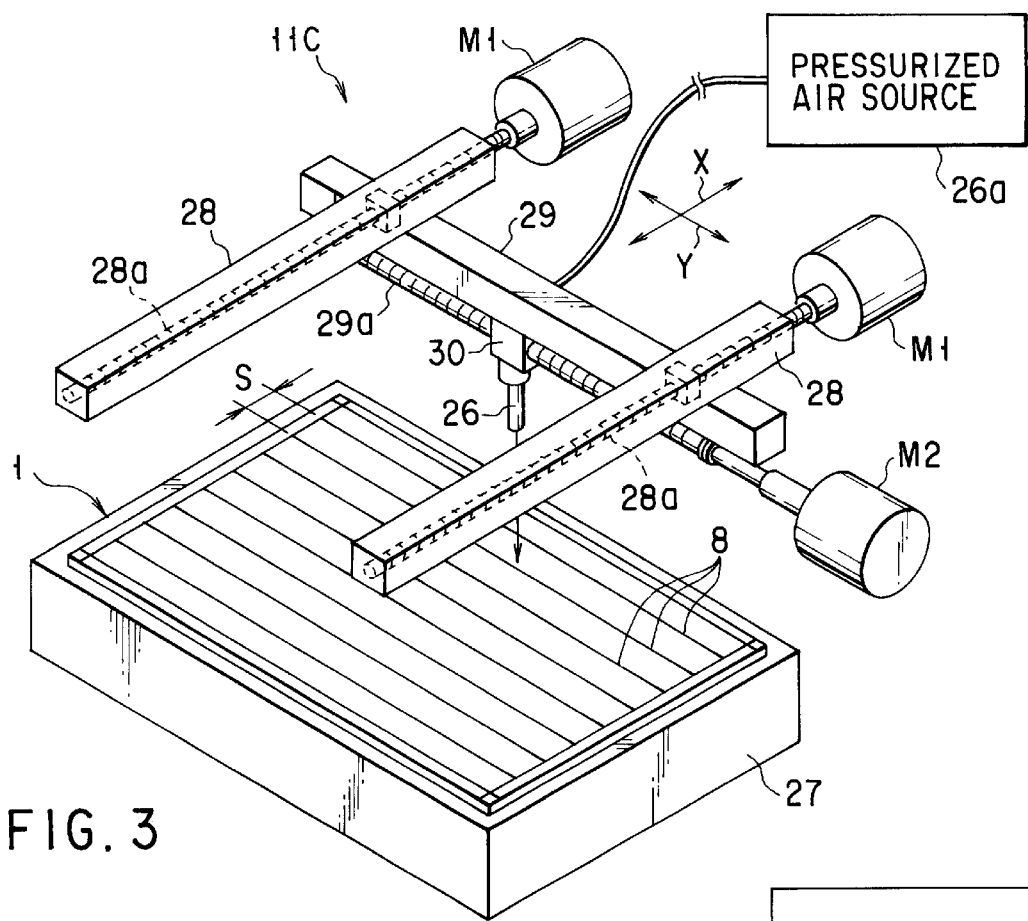
FIG. 3 is a perspective view of a cleaning apparatus according to a third embodiment of the invention.

FIG. 3 shows a cleaning apparatus 11C according to a third embodiment of the invention. In the description of the cleaning apparatus 11C to follow, like reference numerals are used to designate like portions shared with the cleaning apparatus 11A according to the first embodiment, and a description of those portions is omitted. The cleaning apparatus 11C shown in FIG. 3 is provided with a movable air nozzle 26 that can be opposed to the scribed grooves 8 of each photovoltaic module 1. The air nozzle 26 is connected with a pressurized air source 26a, which can supply pressurized air of 5 to 20 atm. A platform 27 underlies the air nozzle 26.

The photovoltaic module 1 is placed horizontally on the platform 27. The platform 27 is overlain by first guide rails 28 extending in the X-axis direction of FIG. 3 and a second guide rail 29 extending in the Y-axis direction perpendicular to the guide rails 28. The guide rails 28 and 29 are provided with ball screws 28a and 29a that are driven by means of motors M1 and M2, respectively. The second guide rail 29, which is provided with a nozzle head 30, is movable in the X-axis direction. The nozzle head 30, which is provided with the downward air nozzle 26, is movable in the Y-axis direction by means of the ball screw 29a. Thus, the air nozzle 26 can move in the X- and Y-axis directions over the photovoltaic module 1.

The following is a description of the function of the cleaning apparatus 11C according to the third embodiment (FIG. 3).

The ball screws 28a and 29a are rotated by means of the motors M1 and M2, whereby the air nozzle 26 is opposed to that scribed groove 8 which is situated on one end side of the photovoltaic module 1. The air nozzle 26 is moved in the Y-axis direction along this groove 8 in a manner such that the pressurized air is jetted from the nozzle 26 toward the groove 8 as the ball screw 29a is rotated. As the air nozzle 26 moves along the scribed groove 8 in this manner, particles P in the groove 8 are blown off by the air.

After cleaning the first scribed groove 8 is finished, the ball screws 28a rotate so that the air nozzle 26 moves in the X-axis direction. Thereupon, the nozzle 26 is opposed to the next scribed groove 8. Thereafter, pressurized air is jetted again from the air nozzle 26 toward the groove 8, and the ball screw 29a rotates so that the nozzle 26 moves in the Y-axis direction along the groove 8. All the scribed grooves 8 of the photovoltaic module 1 are cleaned by repeating these processes of operation.

In this cleaning apparatus 11C, the one air nozzle 26 cleans the scribed grooves 8 one after another. Alternatively, however, a plurality of air nozzles may be located correspondingly individually to pitches S of the grooves 8 so that they can simultaneously clean their corresponding grooves 8. The photovoltaic module 1 may be moved in the X- and Y-axis directions by providing the platform 27 on a table that is movable in the X- and Y-axis directions, instead of moving the air nozzle 26. Further, a fluid jet nozzle may be provided in place of the air nozzle 26 so that a liquid such as pressurized water can be jetted from the jet nozzle toward each groove 8 of the photovoltaic module 1. The liquid is not limited to water and may alternatively be acetone, alcohol, trichloroethylene, Freon, or hydrochloric acid solution.

Figure 4:
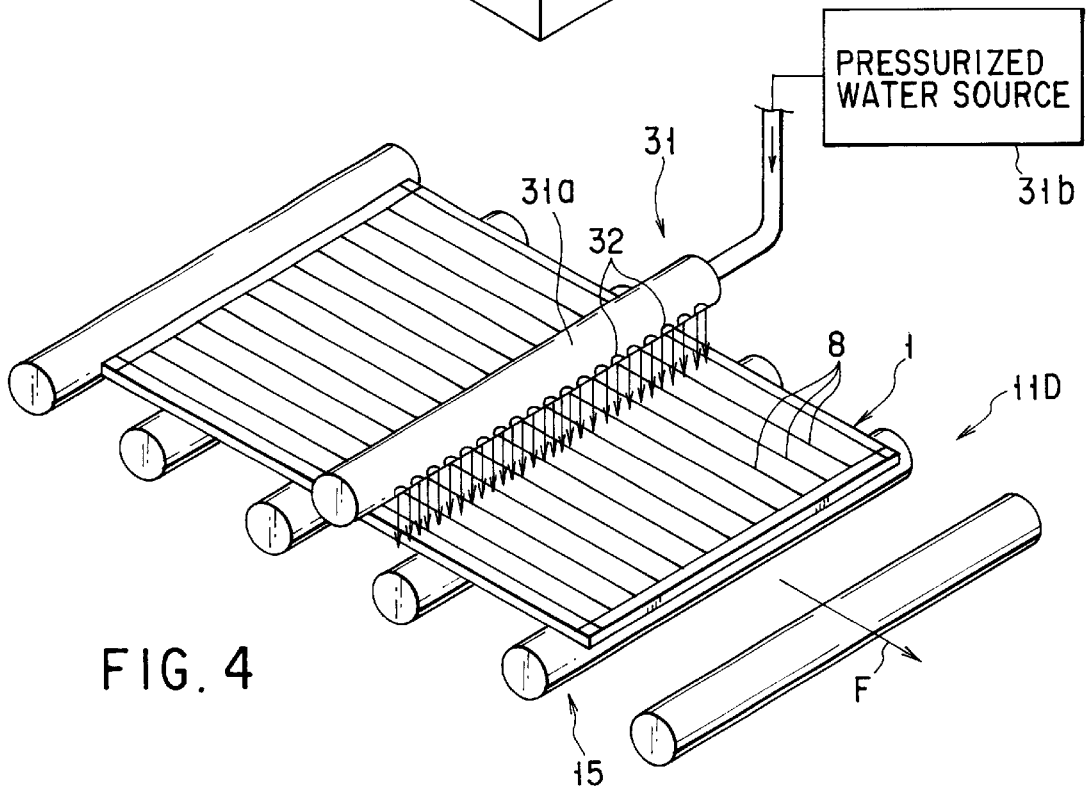
FIG. 4 is a perspective view of a cleaning apparatus according to a fourth embodiment of the invention.

FIG. 4 shows a cleaning apparatus 11D according to a fourth embodiment of the invention. In the description of the cleaning apparatus 11D to follow, like reference numerals are used to designate like portions shared with the cleaning apparatuses 11A and 11B according to the first and second embodiments, and a description of those portions is omitted. The cleaning apparatus 11D shown in FIG. 4 is provided with a conveyor 15 such as a roller conveyor and a jet nozzle mechanism 31 that is located over the conveyor 15. The conveyor 15 serves to transport a photovoltaic module 1 parallel to scribed grooves 8. The jet nozzle mechanism 31 is provided with a hollow nozzle body 31a that extends at right angles to the grooves 8. The nozzle body 31a is provided with a plurality of nozzles 32 that serve to jet pressurized water toward the surface of the laminate L (shown in FIG. 7A) of the photovoltaic module 1. A pressurized water source 31b is connected to the nozzle body 31a. The jet nozzle mechanism 31 is housed in a cleaning box 21, which resembles that of the cleaning apparatus 11B shown in FIG. 2.

The following is a description of the function of the cleaning apparatus 11D. Pressurized water is jetted from the nozzles 32. The photovoltaic module 1 is transported in the direction indicated by arrow F in FIG. 4 by means of the conveyor 15. As the photovoltaic module 1 passes under the jet nozzle mechanism 31, the pressurized water jetted from the nozzles 32 is sprayed against the surface of the laminate L of the module 1 and the grooves 8. Particles P in the grooves 8 are removed by means of the pressurized water. The cleaned module 1 is discharged from the cleaning box. Thus, the photovoltaic module 1 can be cleaned continuously and efficiently by only being passed through the cleaning apparatus 11D.

Figure 5:
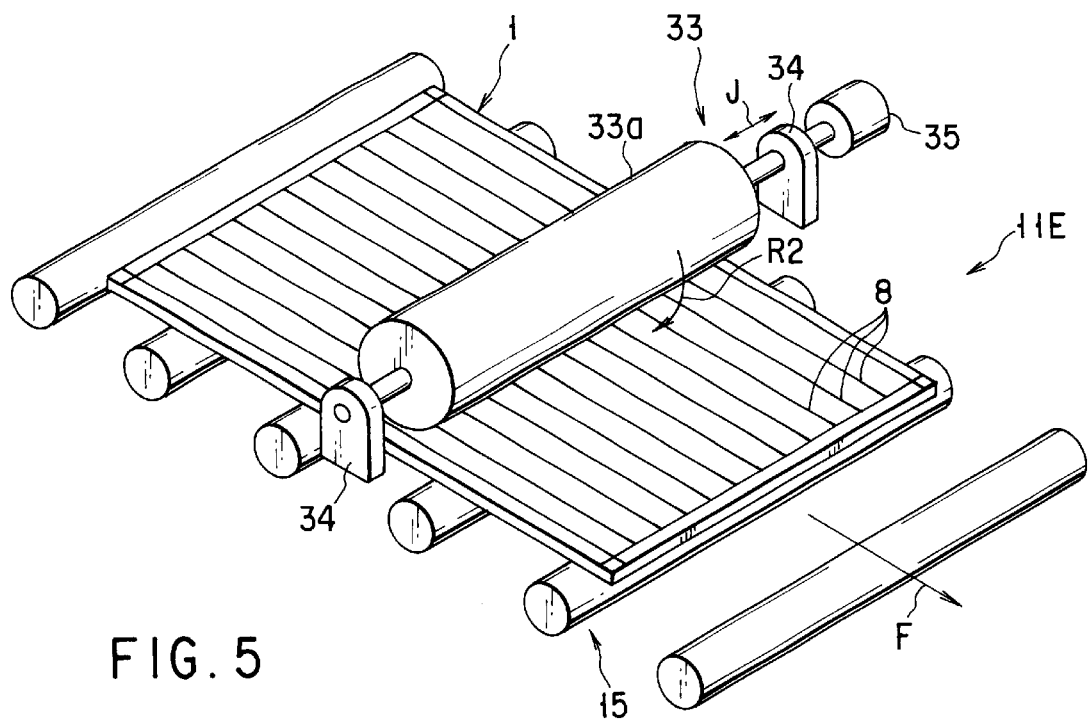
FIG. 5 is a perspective view of a cleaning apparatus according to a fifth embodiment of the invention.

FIG. 5 shows a cleaning apparatus 11E according to a fifth embodiment of the invention. In the description of the cleaning apparatus 11E to follow, like reference numerals are used to designate like portions shared with the cleaning apparatuses 11A and 11B according to the first and second embodiments, and an description of those portions is omitted. The cleaning apparatus 11E shown in FIG. 5 is provided with an adhesive roller 33 that is located over the middle portion of a conveyor 15. The conveyor 15 serves to transport a photovoltaic module 1 parallel to scribed grooves 8. The roller 33 is supported for rotation and movement in the axial direction (direction indicated by arrow J in FIG. 5) by means of a bearing 34. The gum roller 33 can be rotated in the direction indicated by arrow R2 in FIG. 5 by means of a motor 35. The roller 33 has an adhesive surface 33a with adhesive strength of, e.g., 0.01 to 0.05 N/mm on its outer peripheral surface. The adhesive surface 33a can touch the top surface of the photovoltaic module 1.

The following is a description of the function of the cleaning apparatus 11E. The adhesive roller 33 is rotated in the direction indicated by arrow R2 in FIG. 5 by means of the motor 35. The photovoltaic module 1 placed on the conveyor 15 is moved in the direction indicated by arrow F by means of the conveyor 15. As the module 1 passes under the roller 33, the surface of the laminate L of the module 1 touches the adhesive surface 33a of the roller 33. Particles on the surface of the photovoltaic module 1 and in the scribed grooves 8 adhere to the adhesive surface 33a. The module 1, cleared of the particles in this manner, is transported in the direction of arrow F by means of the conveyor 15. According to this cleaning apparatus 11E, the particles can be easily removed by only passing the photovoltaic module 1 under the adhesive roller 33. If the adhesion of the adhesive surface 33a lowers, the whole area of the surface 33a can be used by moving the roller 33 in the axial direction.

Figure 6:
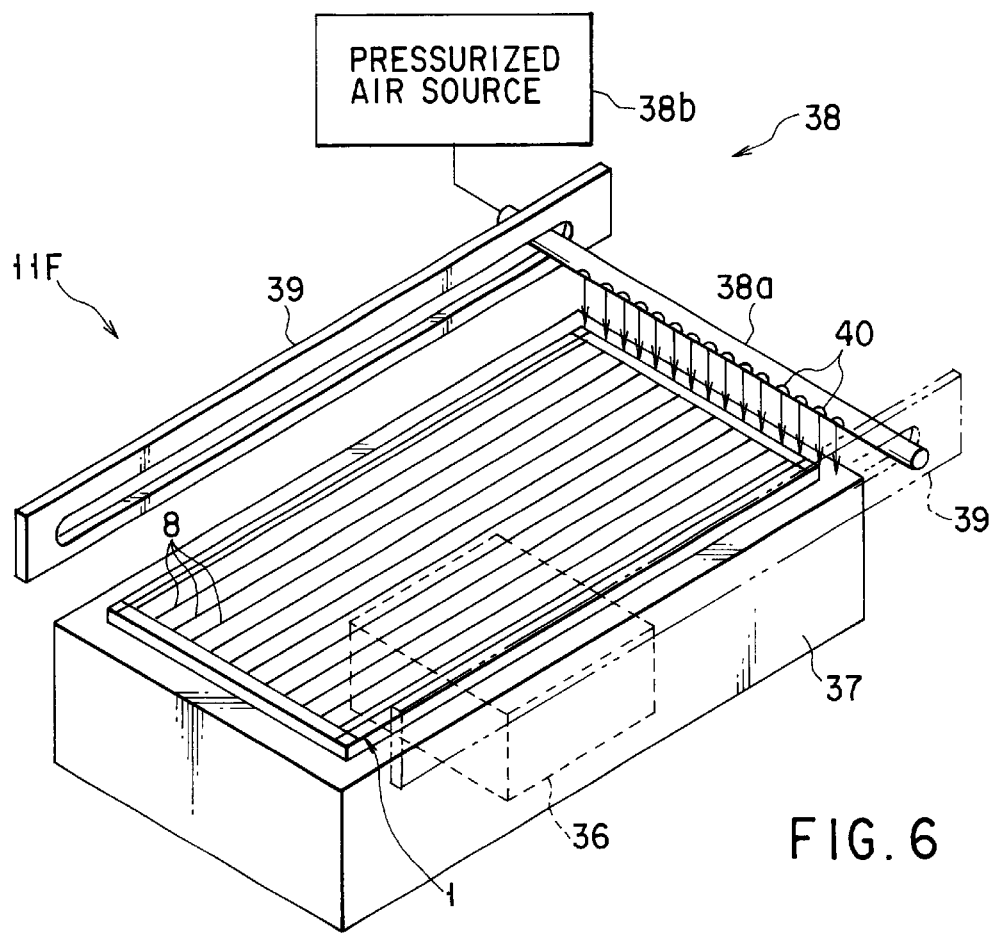
FIG. 6 is a perspective view of a cleaning apparatus according to a sixth embodiment of the invention.

FIG. 6 shows a cleaning apparatus 11F according to a sixth embodiment of the invention. In the description of the cleaning apparatus 11F to follow, like reference numerals are used to designate like portions shared with the cleaning apparatuses 11A and 11B according to the first and second embodiments, and a description of those portions is omitted. The cleaning apparatus 11F shown in FIG. 6 is provided with a vibration generator 36 for applying vibration to a photovoltaic module 1 and a jet nozzle mechanism 38 for blowing air against scribed grooves 8 of the module 1. The vibration generator 36 generates vibration of 5 kHz to 40 kHz, for example. The generator 36 is incorporated in a platform 37.

The photovoltaic module 1 is placed on the platform 37. The jet nozzle mechanism 38 has a hollow body 38a that overlies the platform 37. The body 38a extends at right angles to the scribed grooves 8 of the module 1. A pressurized air source 38b is connected to the body 38a. A pair of guide rails 39 are arranged on the opposite sides of the platform 37, individually. The guide rails 39 extend along the scribed grooves 8 of the photovoltaic module 1. The opposite end portions of the body 38a of the jet nozzle mechanism 38 are supported by means of the rails 39, individually, so that the body 38a can move parallel to the grooves 8. The body 38a of the mechanism 38 is provided with jet nozzles 40 that cover the overall width of the photovoltaic module 1.

The following is a description of the function of the cleaning apparatus 11F. When the vibration generator 36 is actuated, the photovoltaic module 1 on the platform 37 vibrates at strokes of 0.5 mm or less. At the same time, pressurized air is jetted from the nozzles 40 toward the top surface of the module 1, that is, the surface of the laminate L. The pressurized air blows off particles on the surface of the module 1 and in the scribed grooves 8. As the body 38a of the jet nozzle mechanism 38 moves along the grooves 8, all the grooves 8 of the photovoltaic module 1 are cleaned in a short time.

In this cleaning apparatus 11F, a liquid such as pressurized water may be sprayed against the photovoltaic module 1 instead of jetting air from the jet nozzle mechanism 38. Instead of moving the jet nozzle mechanism 38, moreover, the platform 37 may be moved parallel to the scribed grooves 8.

FIGS. 8 to 11 show a cleaning apparatus 100 according to a seventh embodiment of the invention. The cleaning apparatus 100 comprises a conveyor 112, a cleaning chamber 113, and a drying chamber 114. The conveyor 112 is composed of a meshed or ladder-shaped, water-permeable endless belt, for example. The conveyor 112 is moved in the direction indicated by arrow F in FIG. 8 by means of a drive mechanism (not shown). A photovoltaic module 1 is placed horizontally on the conveyor 112. The cleaning chamber 113 and the drying chamber 114, tunnel-shaped, are arranged in the moving direction of the conveyor 112. The drying chamber 114 is provided with a hot-air drier 114a. A curtain 115, formed of a rubber or polymer sheet or strip, is provided on the boundary between the chambers 113 and 114.

Figure 8:
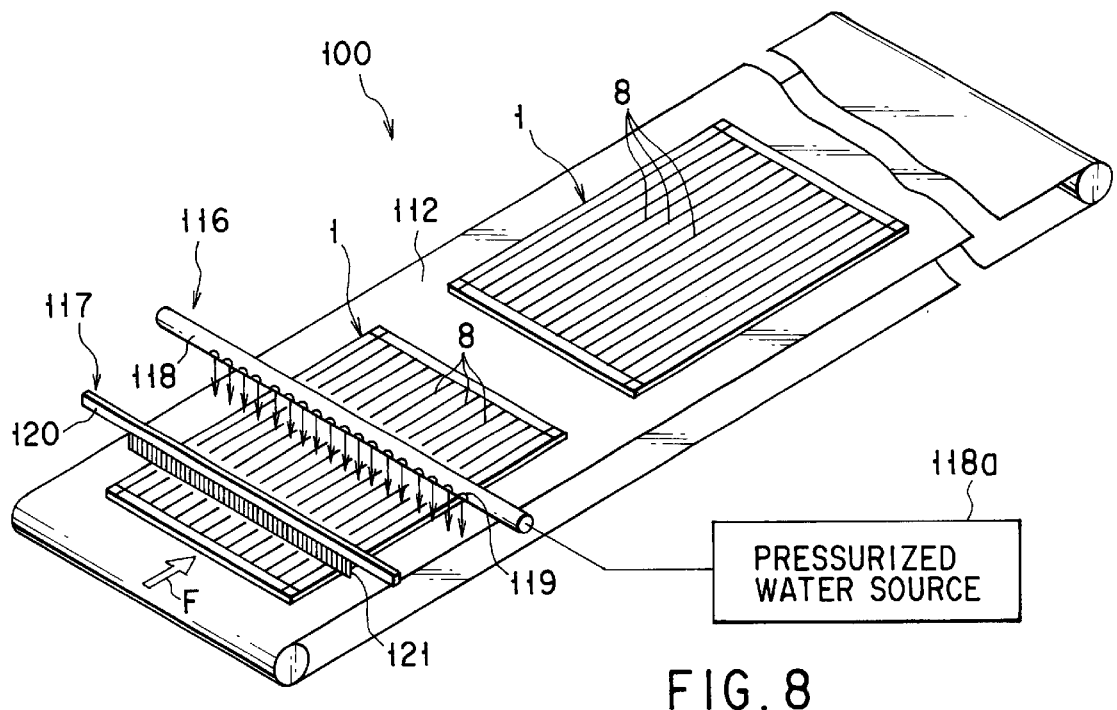
FIG. 8 is a perspective view showing a part of a cleaning apparatus according to a seventh embodiment of the invention.
Figure 9:
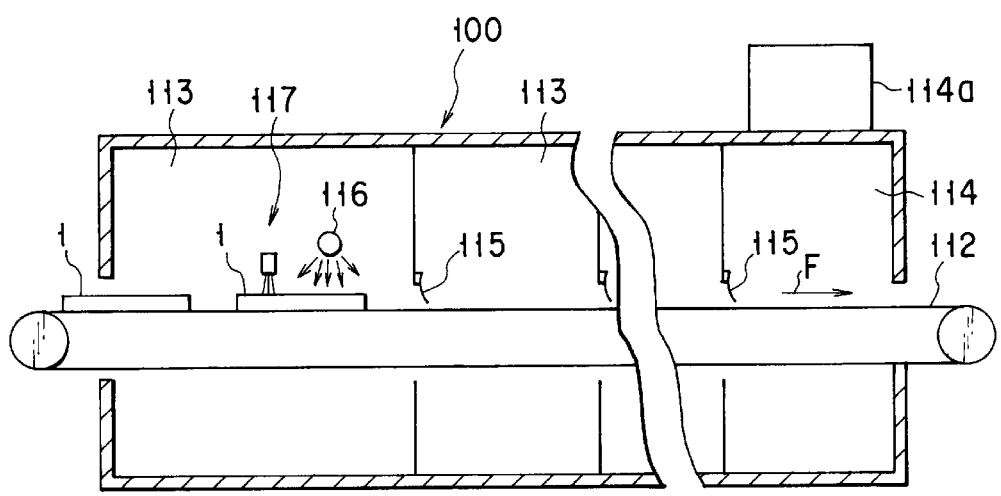
FIG. 9 is a sectional view of the cleaning apparatus shown in FIG. 8.

A jet nozzle mechanism 116 and a conductive brush mechanism 117 are arranged in the cleaning chamber 113. The mechanism 116, which serves as cleaning fluid injection means, jets a cleaning fluid such as pure water toward the surface of the laminate L of the photovoltaic module 1 on the conveyor 112. As shown in FIG. 8, the jet nozzle mechanism 116 has a hollow nozzle body 118, which extends at right angles to the moving direction of the conveyor 112. A cleaning fluid source 118a is connected to the nozzle body 118. The bottom of the nozzle body 118 is formed having a large number of nozzle holes 119, which opens toward the module 1 on the conveyor 112.

Figure 10:
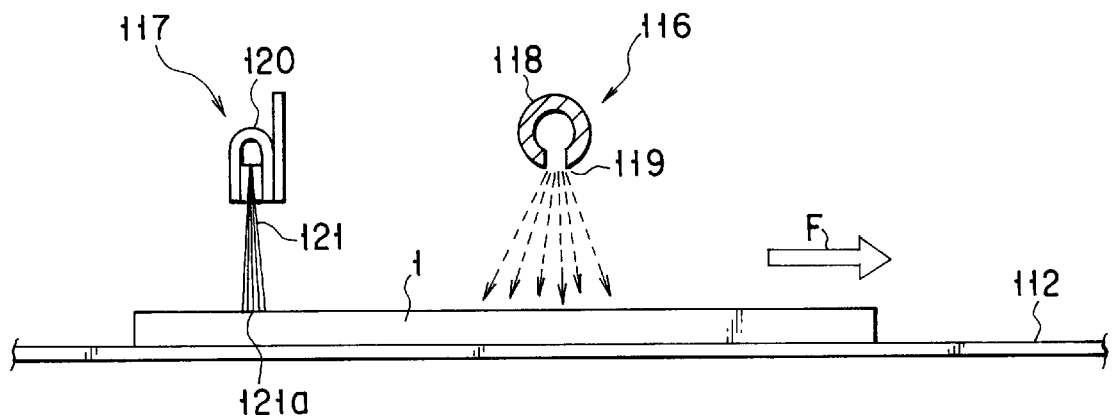
FIG. 10 is a partial enlarged sectional view of the cleaning apparatus shown in FIG. 8.
Figure 11:
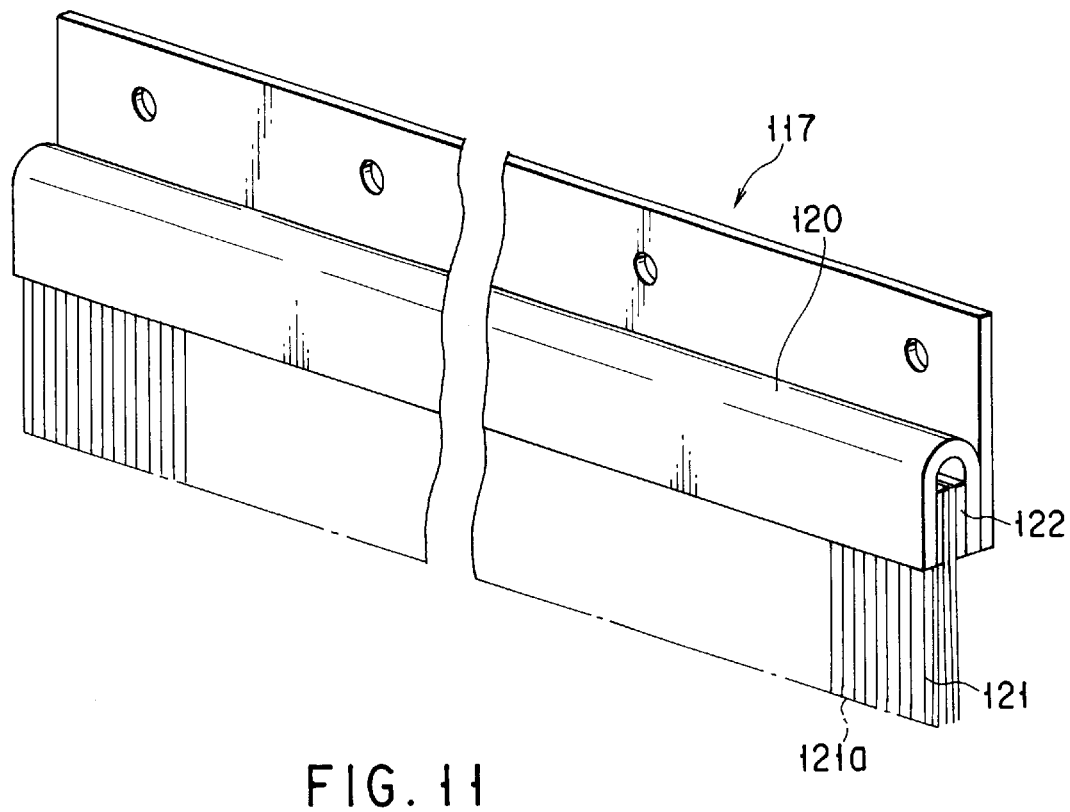
FIG. 11 is a perspective view of a conductive brush mechanism of the cleaning apparatus shown in FIG. 8.

The conductive brush mechanism 117, which serves as electrical contact means, includes a metallic conductive supporter 120 and a conductive brush 121 thereon, as shown in FIGS. 10 and 11. The supporter 120 extends at right angles to the moving direction (direction indicated by arrow F in FIG. 10) of the conveyor 112. The supporter 120 is formed by bending a belt-shaped metal plate so that the cross section of the plate has the shape of an inverted U. The conductive brush 121 is an aggregate of a large number of flexible fibers of a conductive material, such as carbon, stainless steel, or acrylic resin. In the conductive supporter 120, the upper end portion of the brush 121 is fixed to the supporter 120 by means of a fixing member 122 such as a double-adhesive tape. A distal end 121a of the brush 121 can simultaneously touch the peripheral regions 10 and the photovoltaic cells C that constitute the power generating region G (shown in FIG. 14) of the photovoltaic module 1 on the conveyor 112.

The following is a description of the function of the cleaning apparatus 100. The conveyor 112 moves in the direction indicated by arrow F in FIG. 8. The photovoltaic module 1 as an object of cleaning is placed on the conveyor 112 so that its scribed grooves 8 extend parallel to the moving direction of the conveyor 112. As the conveyor 112 moves in the direction of arrow F, the module 1 is loaded into the cleaning chamber 113. In the chamber 113, the conductive brush 121 is opposed to the top surface of the module 1 or the surface of the laminate L. The cleaning fluid is jetted from the nozzle holes 119 toward the module 1.

Thus, the photovoltaic module 1 moves in the cleaning chamber 113 as it is cleaned with the pressurized cleaning water that is jetted from the nozzle holes 119. Before this cleaning operation, the distal end 121a of the conductive brush 121 comes into contact with the peripheral regions 10 and the photovoltaic cells C in the power generating region G of the moving module 1. Accordingly, the peripheral regions 10 and the cells C in the power generating region G are connected electrically to one another, so that they are kept at the same potential. Since there is no potential difference between the regions 10 and the cells C, therefore, ion migration cannot be caused if waterdrops adhere to the grooves 9 that separate the power generating region G from the peripheral regions 10. Since no ion migration occurs, the power generating region G and the peripheral regions 10 can avoid being short-circuited by a metallic crystal. After having been cleaned in the cleaning chamber 113, the photovoltaic module 1 is introduced into the drying chamber 114. After it is dried with hot air in the chamber 114, the module 1 is unloaded from the cleaning apparatus 100.

According to this cleaning apparatus 100, particles in the grooves 8 and 9 can be removed, and development of a metal ion migration can be avoided when the photovoltaic module 1 is cleaned. Accordingly, the photovoltaic module 1 obtained can enjoy high output, insulation, and withstand voltage characteristics. Besides, it is unnecessary to mount the uncleaned photovoltaic module 1 with a short-circuit forming conductor for preventing migration or to remove the conductor from the cleaned module 1.

Figure 12:
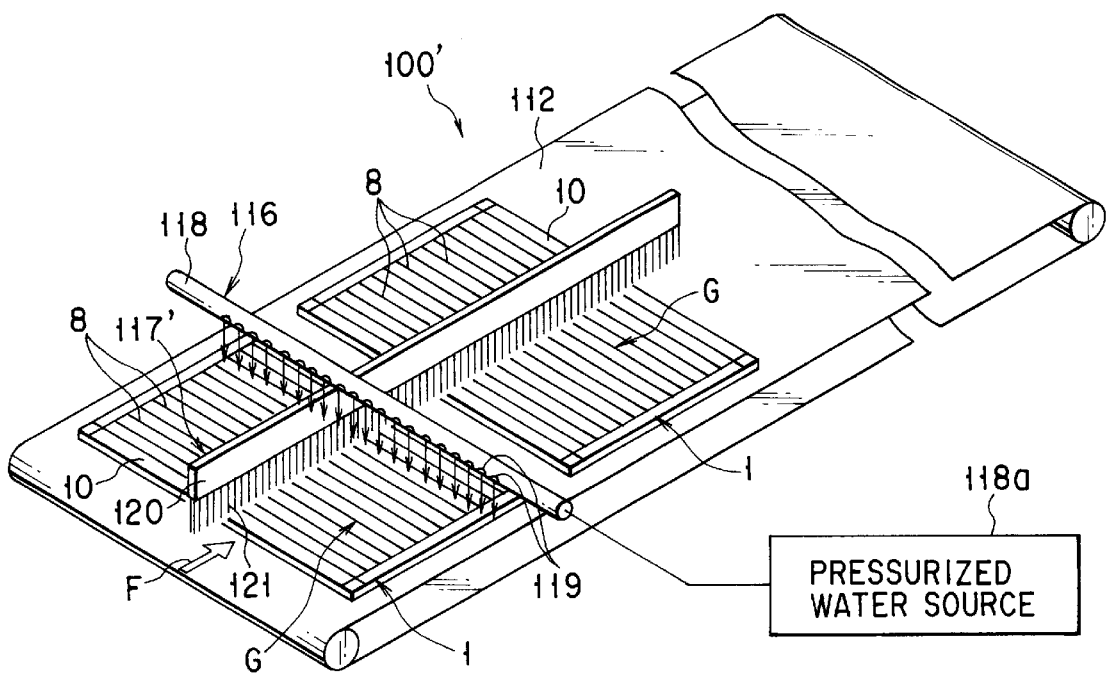
FIG. 12 is a perspective view of a cleaning apparatus according to an eighth embodiment of the invention.
Figure 13:
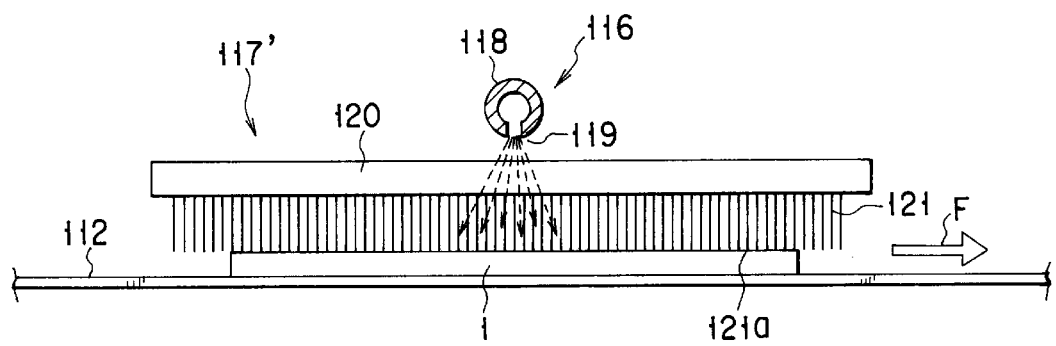
FIG. 13 is a sectional view showing a part of the cleaning apparatus of FIG. 12.

FIGS. 12 and 13 show a cleaning apparatus 100' according to an eighth embodiment of the invention. A conveyor 112 of the cleaning apparatus 100' serves to transport a photovoltaic module 1 at right angles to scribed grooves 8. A jet nozzle mechanism 116 for spraying a liquid such as pure water against the module 1 has a hollow nozzle body 118, which extends at right angles to the moving direction of the conveyor 112. The bottom of the nozzle body 118 is formed having a large number of nozzle holes 119. A cleaning fluid source 118a is connected to the nozzle body 118. A conductive brush mechanism 117', which serves as electrical contact means, includes a metallic conductive supporter 120 extending in the moving direction of the conveyor 112 and a conductive brush 121 attached to the supporter 120. For other details of arrangement, the cleaning apparatus 100' resembles the cleaning apparatus 100 shown in FIGS. 8 to 11. A distal end 121a of the brush 121 can simultaneously touch peripheral regions 10 and cells C in a power generating region G of the photovoltaic module 1 that is placed on the conveyor 112.

The following is a description of the function of the cleaning apparatus 100'. The conveyor 112 moves in the direction indicated by arrow F in FIG. 12. The photovoltaic module 1 is placed on the conveyor 112 so that its scribed grooves 8 extend at right angles to the moving direction of the conveyor 112. As the conveyor 112 moves in the direction of arrow F, the module 1 is loaded into the cleaning chamber 113 (shown in FIG. 9). In the chamber 113, the conductive brush mechanism 117' is situated over the module 1. A cleaning fluid is jetted from the nozzle holes 119 of the jet nozzle mechanism 116.

The photovoltaic module 1 introduced into the cleaning chamber 113 moves as it is cleaned with the cleaning fluid that is jetted from the nozzle holes 119. As this is done, the distal end 121a of the conductive brush 121 touches the peripheral regions 10 and the cells C in the power generating region G of the moving module 1. Thus, the photovoltaic cells C and the peripheral regions 10 are connected electrically to one another, so that they are kept at the same potential. Since there is no potential difference between the regions 10 and the cells C, therefore, no ion migration develops if waterdrops adhere to the grooves 9 that separate the power generating region G from the peripheral regions 10. Since no ion migration develops, the power generating region G and the peripheral regions 10 can avoid being short-circuited by a metallic crystal.

Although the conveyor 112 formed of a water-permeable endless belt is used as the means for transporting each photovoltaic module 1 in the cleaning apparatuses 100 and 100', it may alternatively be replaced with a roller conveyor, for example. The conductive brush 121 may be partially located on the supporter 120, corresponding to the pitches of arrangement of the photovoltaic cells C, instead of being located covering the overall length of the supporter 120.

Further, the cleaning apparatuses 100 and 100' may also use the ultrasonic cleaning described in connection with the cleaning apparatus 11A according to the first embodiment or the rotary-brush cleaning described in connection with the cleaning apparatus 11B according to the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for cleaning a photovoltaic module, the photovoltaic module having a laminate including a first electrode layer formed on an insulating substrate, a photovoltaic layer, and a second electrode layer, the laminate being electrically divided between a power generating region and peripheral regions by means of grooves, the power generating region being divided into a plurality of photovoltaic cells by means of laser-scribed grooves, at least some of the photovoltaic cells being connected electrically in series with one another, the cleaning method comprising:

a process for transporting the photovoltaic module immersed in a cleaning fluid, while being kept in a horizontal position with the laminate upward as it is transported, and applying ultrasonic vibration to the cleaning fluid, thereby removing particles in the scribed grooves.

2. The method according to claim 1, wherein the cleaning fluid is selected from the group consisting of pure water, tap water, acetone, methanol, ethanol, trichloroethylene, Freon, and water that contains detergent.

3. The method according to claim 1, wherein the photovoltaic module is transported by means of a conveyor.

4. The method according to claim 1, wherein the ultrasonic vibration propagates through the cleaning fluid and separates particles from the scribed grooves.

5. The method according to claim 1, further comprising discharging the photovoltaic module from the cleaning fluid and blowing pressurized air across the photovoltaic module to remove cleaning fluid adhering to the photovoltaic module.

6. A method for cleaning a photovoltaic module, the photovoltaic module having a laminate including a first electrode layer formed on an insulating substrate, a photovoltaic layer, and a second electrode layer, the laminate being electrically divided between a power generating region and peripheral regions by means of grooves, the power generating region being divided into a plurality of photovoltaic cells by means of laser-scribed grooves, at least some of the photovoltaic cells being connected electrically in series with one another, the cleaning method comprising:

a process for bringing a rotating brush into contact with the laminate of the photovoltaic module and blowing pressurized air against the laminate simultaneously, thereby removing particles in the scribed grooves.

7. The method according to claim 6, wherein the rotating brush includes brush fibers that come into contact with the scribed grooves.

8. The method according to claim 6, wherein the pressurized air is blown toward the scribed grooves.

9. The method according to claim 6, further comprising removing the rotating brush from contact with the laminate of the photovoltaic module.

10. A method for cleaning a photovoltaic module, the photovoltaic module having a laminate including a first electrode layer formed on an insulating substrate, a photovoltaic layer, and a second electrode layer, the laminate being electrically divided between a power generating region and peripheral regions by means of grooves, the power generating region being divided into a plurality of photovoltaic cells by means of laser-scribed grooves, at least some of the photovoltaic cells being connected electrically in series with one another, the cleaning method comprising:

a process for blowing pressurized air along the scribed grooves of the photovoltaic module by means of a plurality of air nozzles which are located to correspond individually to pitches of the scribed grooves while moving the air nozzles in parallel and relatively to the scribed grooves, thereby removing particles in the scribed grooves.

11. The method according to claim 10, wherein the plurality of air nozzles are spaced apart such that each air nozzle blows the pressurized air along one of the scribed grooves.

12. The method according to claim 10, wherein a pressurized liquid is jetted along the scribed grooves instead of blowing the pressurized air along the scribed grooves.

13. The method according to claim 12, wherein the pressurized liquid is selected from the group consisting of water, acetone, alcohol, trichloroethylene, Freon, and hydrochloric acid solution.

14. A method for cleaning a photovoltaic module, the photovoltaic module having a laminate including a first electrode layer formed on an insulating substrate, a photovoltaic layer, and a second electrode layer, the laminate being electrically divided between a power generating region and peripheral regions by means of grooves, the power generating region being divided into a plurality of photovoltaic cells by means of laser-scribed grooves, at least some of the photovoltaic cells being connected electrically in series with one another, the cleaning method comprising:

a process for spraying pressurized water against the laminate of the photovoltaic module by means of nozzles while moving the nozzles in parallel and relatively to the scribed grooves, thereby removing particles in the scribed grooves.

15. The method according to claim 14, wherein the pressurized water is sprayed from a plurality of nozzles.

16. The method according to claim 14, wherein the pressurized water is sprayed against the scribed grooves.

17. The method according to claim 14, wherein the particles are removed by means of the pressurized water.

18. The method according to claim 14, further comprising transporting the photovoltaic module through the spray of pressurized water.

* * * * *